(12) United States Patent
Ablas Marques

(10) Patent No.: US 10,487,405 B2
(45) Date of Patent: Nov. 26, 2019

(54) PISTON RING AND INTERNAL COMBUSTION ENGINE

(71) Applicants: Mahle Metal Leve S/A, Jundiaí (BR); Mahle International GmbH, Stuttgart (DE)

(72) Inventor: Gisela Ablas Marques, Jundiaí (BR)

(73) Assignees: Mahle Metal Leve S/A (BR); Mahle International GmbH (DE)

( * ) Notice: Subject to any disclaimer, the term of this patent is extended or adjusted under 35 U.S.C. 154(b) by 219 days.

(21) Appl. No.: 15/520,355

(22) PCT Filed: Oct. 16, 2015

(86) PCT No.: PCT/EP2015/073962
§ 371 (c)(1),
(2) Date: Apr. 19, 2017

(87) PCT Pub. No.: WO2016/062620
PCT Pub. Date: Apr. 28, 2016

(65) Prior Publication Data
US 2017/0327957 A1 Nov. 16, 2017

(30) Foreign Application Priority Data
Oct. 20, 2014 (BR) .................. 10 2014 026128 1

(51) Int. Cl.
*F16J 9/26* (2006.01)
*C23C 28/04* (2006.01)
(Continued)

(52) U.S. Cl.
CPC .............. *C23C 28/044* (2013.01); *C23C 8/26* (2013.01); *C23C 8/80* (2013.01); *C23C 14/0641* (2013.01); *F16J 9/26* (2013.01); *C23C 28/00* (2013.01)

(58) Field of Classification Search
USPC ......................... 277/442, 443, 444
See application file for complete search history.

(56) References Cited

U.S. PATENT DOCUMENTS 5,154,433 A * 10/1992 Naruse ............ F16J 9/26
277/443
5,960,762 A 10/1999 Imai
(Continued)

FOREIGN PATENT DOCUMENTS

| CN | 1116251 A | 2/1996 |
|---|---|---|
| EP | 1304393 A1 | 4/2003 |

(Continued)

OTHER PUBLICATIONS

English abstract for JP-2002317225.
(Continued)

*Primary Examiner* — Archene A Turner
(74) *Attorney, Agent, or Firm* — Fishman Stewart PLLC

(57) ABSTRACT

A piston ring may include a stainless steel base having between 8% and 15% by weight of chromium, together with other elements and impurities, and having a hardness between 350 HV and 420 HV. The piston ring may also include a superficial nitrided layer having a depth of no more than 60 μm and an average hardness measured upon the surface exceeding 800 HV. The nitrided layer may include a plurality of nitride particles, which may have a maximum size of 5 μm and may be distributed over between 4% and 8% of an area of the nitrided layer.

18 Claims, 1 Drawing Sheet

(51) Int. Cl.
*C23C 8/26* (2006.01)
*C23C 8/80* (2006.01)
*C23C 14/06* (2006.01)
*C23C 28/00* (2006.01)

(56) References Cited

U.S. PATENT DOCUMENTS 6,508,473 B1 * 1/2003 Tanaka ................ C23C 14/0641
                                                                                   277/443
2004/0040631 A1    3/2004 Takahashi et al.

FOREIGN PATENT DOCUMENTS

| GB | 2296257 A | 6/1996 |
| JP | 2001-335878 * | 12/2001 |
| JP | 2002317225 A | 10/2002 |

OTHER PUBLICATIONS

Office Action dated Oct. 10, 2018 for copending Chinese Patent Application No. 201580055195.2.
English Abstract for CN1116251A.

\* cited by examiner

PISTON RING AND INTERNAL COMBUSTION ENGINE

CROSS-REFERENCE TO RELATED APPLICATIONS

This application claims priority to Brazilian Patent Application No. BR 10 2014 026128 1, filed on Oct. 20, 2014, and International Patent Application No. PCT/EP2015/073962, filed on Oct. 16, 2015, both of which are hereby incorporated by reference in their entirety.

TECHNICAL FIELD

The present invention relates, in a general manner, to a component of an internal combustion engine and, more specifically, the present invention is related to a piston ring of an internal combustion engine. The present invention furthermore relates to an internal combustion engine containing such ring.

BACKGROUND

Internal combustion engines, such as the engines employing the known Otto or Diesel cycles, are widely and commonly utilized in vehicles destined for the movement of both persons and of goods, such as passenger, haulage and freight vehicles, including lorries and locomotives. In summary, such engines utilize a fuel having a high hydrocarbon content, such as fossil fuels and/or those originating from renewable sources, to transform the thermal energy from the burning of the fuel into kinetic energy.

The construction of an internal combustion engine is well known and consists, basically, of a piston moving within the interior of a cylinder associated with a crankshaft. On the upper side of the piston there is provided a combustion chamber comprising, among other elements such as spark plugs and/or injection nozzles, at least one intake valve and one exhaust valve. The piston, in turn, generally comprises three rings in contact with the cylinder liner, the upper two rings, that is to say those most proximal to the head of the piston whereat is realized the compression of the combustion gases in the chamber, have the function of ensuring the sealing of the mixture and preventing the escape both of the mixture and of the combustion gases to the interior of the block and, by virtue thereof, they are generally denominated "compression rings". The third ring, normally located below the two compression rings, has the objective of removing or "scraping" the oil film when the piston descends to prevent the burning of the oil and, in this manner, to moreover reduce the emission of gases. This ring is generally denominated "scraper ring".

The components and operation of an internal combustion engine both of the Otto cycle and of the Diesel cycle are of common knowledge to those versed in the art, for which reason greater explanations are unnecessary in the present descriptive memorandum.

There exists today a growing concern in respect of the reduction in the emissions of gases produced by internal combustion engines, responsible for a large part of the release of $CO_2$ into the atmosphere. Climate change is one of the most relevant current environmental challenges, having possibly grave consequences. This problem is being caused by the intensification of the greenhouse effect which, in turn, is related to the increase of the concentration in the atmosphere of greenhouse gases (GGs), among them carbon dioxide.

With the objective of minimizing the emission into the environment of harmful gases, such as carbon monoxide (CO), hydrocarbon gases (HCs), nitrogen oxides (NOx), together with particulate materials and/or other GGs, a series of technologies has been incorporated into internal combustion engines in recent years. The reduction in emissions of gases is related, among other factors, to the increase in the thermal performance of engines and, consequently, the reduction in the specific consumption of fuel.

In this sense, technologies such as electronic injection, the catalyst, and particulate matter filters are, today, very widespread and employed in an almost obligatory manner in all internal combustion engines. Other more recent technologies, such as the direct injection of fuel, the common rail for engines utilizing the Diesel cycle, and the utilization on a greater scale of technologies known for a long time, such as mechanical compressors or turbocompressors, are also becoming associated with the objective of increasing energy efficiency and complying with increasingly rigid emission regulations.

As a consequence, combustion engines are developing greater power per volume of displacement of the piston within the cylinder, commonly referred to as specific power output. The performance of an Otto cycle combustion engine in the decade of the 1980s attained, on average, 50 HP/l, and today it may easily attain in excess of 100 HP/l. This means that the combustion pressure within the interior of the cylinders has considerably increased, this also meaning that combustion engines are working under greater mechanical stresses, faster rotation and higher combustion temperature. In this manner, the components thereof must likewise be dimensioned to support these harsher operating conditions in order both to ensure the reliability of the assembly and to maintain the expected working life, today estimated as being approximately 300 000 km for Otto cycle engines in motorcars.

This greater operational stress is translated, likewise, into a greater stress suffered by the components, inter alia the piston and the rings associated with the piston. With the greater degree of compression, combustion pressure, temperature and rotation, the rings also exercise greater pressure upon the piston and upon the walls of the cylinder, likewise leading to greater wear or fatigue of the rings which may increase the play existing between the ring and the cylinder and, in this manner, causing problems related with the wear of the cylinder liner and/or of the piston itself, oil leakage, increase in fuel and/or oil consumption and, even, the rupture of the ring.

The present invention has the objective of overcoming these and other drawbacks encountered in the state of the art.

SUMMARY

Consequently, a first object of the present invention is to provide a piston ring having improved characteristics of rupture strength.

An additional object of the invention is to provide a piston ring having improved mechanical fatigue characteristics and, consequently, rupture strength.

With the objective of satisfying the foregoing and other objects, the present invention relates to a piston ring realized in stainless steel comprising between 8 and 15% by weight of chromium, together with other elements and inevitable impurities, having a hardness comprised between 350 and 420 HV, wherein the said ring comprises a superficial nitrided layer having a depth less than or equal to 60 μm and having an average hardness measured upon the surface exceeding 800 HV, wherein the particles of nitride of the nitrided layer possess a maximum size of 5 μm and being distributed over between 4 and 8% of the area of the nitrided layer.

According to additional and/or alternative embodiments of the invention, the following characteristics, alone or in technically possible combinations, may also be present:
the white layer is absent in the nitrided layer;
said ring is a compression ring of a piston of an internal combustion engine;
said stainless steel is a martensitic stainless steel;
said ring is realized in a stainless steel comprising from 8 to 15% by weight of Cr, from 0.4 to 0.9% by weight of C, from 0.1 to 1% by weight of Si, from 0.1 to 1% by weight of Mn, up to 0.04% by weight of P, and up to 0.04% by weight of S, the balance being formed by Fe and inevitable impurities;
said ring additionally comprises a coating of chromium applied upon one of the surfaces thereof;
the said surface is the surface of contact of the ring with the cylinder liner;
said coating is applied by means of an ion deposition process.

The invention furthermore concerns an internal combustion engine comprising at least one cylinder and at least one piston mounted within the interior of the said cylinder and additionally comprising at least one ring as aforedefined.

DETAILED DESCRIPTION

Figure 1:
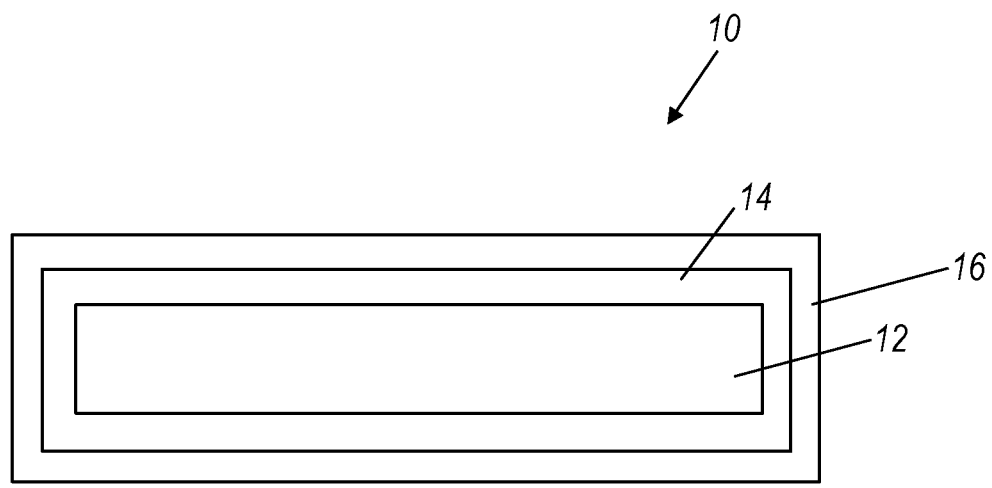
FIG. 1 illustrates an exemplary piston ring according to one embodiment.
Figure 2:
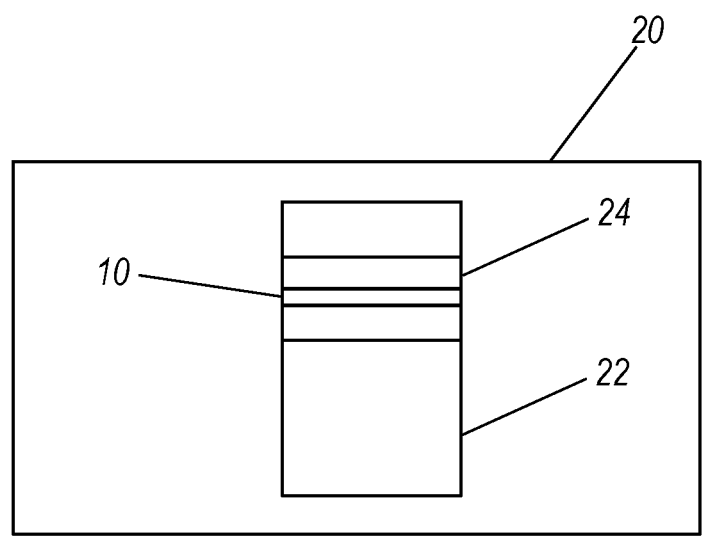
FIG. 2 illustrates an internal combustion engine according to one embodiment.

The invention shall now be described in relation to the particular embodiments thereof. Specific embodiments are described in detail, it being understood that they shall be considered as an exemplification of the principles thereof and not destined to restrict the invention to solely that described in the present memorandum. It shall be recognized that the different teachings of the embodiments discussed below may be employed separately or in any combination appropriate for producing the same technical effects.

As aforementioned, demands are being increasingly placed on internal combustion engines in terms of mechanical stresses and, consequently, the components thereof are being subjected to greater operational stresses. The piston ring is an essential component to ensure the appropriate functioning of the engine, both in terms of performance and in terms of fuel consumption and control of emission of gases.

The piston rings known in general are realized in a material presenting characteristics of high wear resistance and, consequently, generally utilize a martensitic stainless steel having a high chromium content, typically exceeding 17% by weight of chromium, and may also receive a nitriding treatment to increase the superficial hardness and the wear and corrosion resistance.

However, it has been shown that a piston ring realized in material having high hardness characteristics, such as the rings found in the state of the art, may likewise have a tendency to rupture by virtue of the propagation of microfissures which may form during the operation of the internal combustion engine. This occurs as a result of the greater presence of hard phases (carbides) following the nitriding and, in this manner, the greater disposition to crack propagation subsequent to these being initiated in the interface between the hard phases and the matrix.

The invention has the objective on the one hand of providing a piston ring 10 having the same hardness characteristics and, consequently, high wear resistance, nevertheless promoting a greater tenacity in the ring such as to improve the qualities thereof of fatigue strength, both static and dynamic, in order to minimize or even eliminate problems related with the rupture of the ring.

In this sense, the invention concerns a ring 10 of an internal combustion engine 20 mounted upon the piston 24 of the engine 20 and in contact with the cylinder 22 wall or liner. The ring is realized, in a particular manner, in a stainless steel 12 comprising between 8 and 15% by weight of chromium, in addition to other elements and inevitable impurities, the balance being formed by iron. Typically, a stainless steel having these characteristics in the composition thereof comprises an average hardness lying between 350 and 420 HV.

Chromium, as is known by those versed in the art, is an element fundamental for promoting, in addition to an increase in hardness, corrosion resistance, and is also found dissolved in the iron matrix in the form of chromium carbide.

The ring 10 additionally comprises a peripheral nitrided layer 14 promoting an increase in the superficial hardness, typically an average hardness measured upon the surface exceeding 800 HV. The processes of nitriding are well known by those versed in the art and, basically, consist in placing the metal component, generally steel, including stainless steel, in a nitrogen rich environment at a temperature below the austenitisation temperature of the material, and may be realized both by a gaseous and a plasma process. The nitrogen diffused within the material creates a layer increasing the superficial hardness thereof. As a result, the nitriding generally creates two layers in the metal material. A first superficial layer, also called a white layer or compound layer, having a predominance of ε-nitrides (with $Fe_{2-3}N$ nitrides containing N in a quantity exceeding 8% by weight) over γ'-phase nitrides (with $F_4N$ nitrides containing N between 5.9 and 6.5% by weight), and a second diffusion layer.

During the nitriding treatment the nitrogen diffuses from the surface of the part and, by virtue of the fact that the affinity of the nitrogen for the chromium is greater than for the carbon, a reaction occurs between the nitrogen and the chromium carbides forming chromium nitrides, in addition to residual carbon nitrides and chromium carbides. It has been shown that when the percentage of chromium exceeds 15% by weight, the tenacity of the material is prejudiced by virtue of the presence of large particles, that is to say having an average size exceeding 5 μm, and this characteristic may occasion small fissures which may propagate and generate ruptures in the ring. Furthermore, it has been found that when the chromium content lies between 8 and 15% by weight it is possible to obtain hard particles in the nitrided layer 14 having an average particle size not exceeding 5 μm and which, preferably, should be dispersed over between 4 and 8% of the area of the nitrided layer 14. This characteristic permits the material to present good tenacity, significantly improving the fatigue strength, both static and dynamic, without prejudicing the hardness found on the surface of the ring 10, ensuring a good wear resistance.

An example of a suitable composition of a stainless steel 12 for the ring 10 of the invention comprises from 8 to 15% by weight of Cr, from 0.4 to 0.9% by weight of C, from 0.1 to 1% by weight of Si, from 0.1 to 1% by weight of Mn, up to 0.04% by weight of P, and up to 0.04% by weight of S, the balance being formed by Fe and inevitable impurities. Nevertheless other compatible compositions may also be utilized.

Also, in a particular manner, the nitrided layer 14 possesses a penetration of less than or equal to 60 μm, having the objective of maintaining the good tenacity of the ring 10 and, furthermore, the relatively small penetration of the nitrided layer 14 likewise permits a lesser propagation of cracks, generally forming in the interface between the hard phase and the steel. Additionally, the nitrided layer 14 does not possess the white layer, that is to say it presents an absence of the white layer. The absence of the white layer may be realized through known means, such as applying a grinding process upon the surface of the ring, or by controlling the parameters of the nitriding treatment. Such means of promoting an absence of the white layer are known by those versed in the art, for which reason greater explanations are dispensed with in the present descriptive memorandum.

The ring 10 of the invention may additionally comprise a layer 16 of CrN applied by an ion deposition process. The implantation of ions is a process already known by means whereof ions of a material are accelerated in a magnetic field and irradiated upon the metal material. By virtue of the fact that the ions possess a mass and composition differing from the material whereupon they are irradiated, the impact leads to their having a limited penetration and are affixed within the material, creating free ions present in the composition of the material. In a particular manner, the contact surface with the wall receives the additional layer 16 of chromium. The additional layer 16 of CrN may be advantageous both to improve the resistance to wear of the surface of the ring 10 in contact with the cylinder 22 wall or liner and to improve the corrosion resistance, particularly permitting a greater resistance to intergranular corrosion.

In spite of the invention having been described in relation to the particular embodiments thereof, those versed in the art will be able to realize alterations or combinations not contemplated above without, nevertheless, deviating from the teachings herein described, in addition to extension to other applications not considered in the present descriptive memorandum. For example, in spite of the embodiment herein described making reference to a scraper ring of an internal combustion engine, it is obvious that the process of the invention may be applied to other parts, the improved superficial hardness characteristic whereof may be desirable, such as the compression ring. Consequently, the appended claims shall be interpreted as covering each and every equivalent falling within the principles of the invention.

The invention claimed is:

1. A piston ring comprising:
   a stainless steel base including between 8% and 15% by weight of chromium, together with other elements and impurities, and having a hardness between 350 HV and 420 HV, and
   a superficial nitrided layer having a depth of no more than 60 μm and an average hardness measured upon the surface exceeding 800 HV,
   wherein the nitrided layer includes a plurality of nitride particles having a maximum size of 5 μm distributed over between 4% and 8% of an area of the nitrided layer, and
   wherein a white layer is absent in the nitrided layer.

2. The piston ring as claimed in claim 1, wherein the piston ring is a compression ring of a piston of an internal combustion engine.

3. The piston ring as claimed in claim 1, wherein the other elements include from 0.4% to 0.9% by weight of C, from 0.1% to 1% by weight of Si, from 0.1% to 1% by weight of Mn, up to 0.04% by weight of P, and up to 0.04% by weight of S, the balance of the stainless steel base including Fe and the impurities.

4. The piston ring as claimed in claim 1, further comprising a coating of chromium disposed on a surface thereof.

5. The piston ring as claimed in claim 4, wherein the chromium coating is disposed on a surface of the piston ring that contacts a cylinder liner.

6. The piston ring as claimed in claim 5, wherein the chromium coating is applied by ion deposition.

7. The piston ring as claimed in claim 4, wherein the chromium coating is applied by ion deposition.

8. The piston ring as claimed in claim 1, wherein the stainless steel base is a martensitic stainless steel.

9. The piston ring as claimed in claim 1, wherein the piston ring is a compression ring of a piston of an internal combustion engine.

10. The piston ring as claimed in claim 1, wherein the other elements include from 0.4% to 0.9% by weight of C, from 0.1% to 1% by weight of Si, from 0.1% to 1% by weight of Mn, up to 0.04% by weight of P, and up to 0.04% by weight of S.

11. The piston ring as claimed in claim 1, further comprising a coating of chromium disposed on a surface thereof.

12. The piston ring as claimed in claim 11, wherein the chromium coating is disposed on a surface of the piston ring that contacts a cylinder liner.

13. The piston ring as claimed in claim 12, wherein the chromium coating is applied by ion deposition.

14. The piston ring as claimed in claim 11, wherein the chromium coating is applied by ion deposition.

15. The piston ring as claimed in claim 1, wherein the stainless steel base is composed of a martensitic stainless steel.

16. An internal combustion engine comprising:
    at least one cylinder,
    at least one piston mounted within an interior of the at least one cylinder, and
    at least one piston ring having:
       a stainless steel base including between 8% and 15% by weight of chromium, together with other elements and impurities, and having a hardness between 350 HV and 420 HV,
       a superficial nitrided layer having a depth of no more than 60 μm and an average hardness measured upon the surface exceeding 800 HV, the nitrided layer including a plurality of nitride particles having a maximum size of 5 μm distributed over between 4% and 8% of an area of the nitrided layer, and
       a coating of chromium disposed on the nitrided layer.

17. A compression ring of a piston of an internal combustion engine, comprising:
    a stainless steel base having between 8% and 15% chromium by weight, and a hardness between 350 HV and 420 HV;
    a superficial nitrided layer having a maximum depth of 60 μm and an average surface hardness exceeding 800 HV; and
    a chromium coating disposed on the nitrided layer;
    wherein the nitrided layer includes a plurality of nitride particles distributed over between 4% and 8% of an area of the nitrided layer, the nitride particles having a maximum size of 5 μm; and wherein a white layer is absent in the nitrided layer.

18. The compression ring as claimed in claim 17, wherein the chromium coating is applied by ion deposition.

\* \* \* \* \*